United States Defensive Publication [19] (H) [11] T955,007

Milkovic [43] Feb. 1, 1977

[54] METHOD AND APPARATUS FOR METERING APPARENT ENERGY

[75] Inventor: Miran Milkovic, Scotia, N.Y.

[73] Assignee: General Electric Company, New York, N.Y.

[21] Appl. No.: 697,892

[22] Filed: June 21, 1976

Related U.S. Application Data

[63] Continuation of Ser. No. 528,041, Nov. 29, 1974.

[51] Int. Cl.[2] ..... G01R 21/06

[52] U.S. Cl. ..... 324/141; 324/142

[57] ABSTRACT

Metering kVA and kVAh in an electrical system is accomplished by generating pairs of analog signals representing current and voltage variables. Each of the analog signals is synchronously rectified to provide a pair of full-wave rectified signals which are multiplied together in a pulse-width amplitude multiplier network to produce a product signal having a DC component which is proportional to the product of the voltage and current variables. In addition, the product signal includes AC components which are filtered out in a low pass filter to thereby provide an output signal which is proportional to the apparent power in the electrical system. The apparent electrical power signal is converted to an apparent electrical energy signal by means of an analog to-pulse converter wherein each output pulse thereof corresponds to a predetermined amount of apparent energy in the electrical system.

3 Claims, 1 Sheet Drawing,

14 Pages Specification

The file of this unexamined application may be inspected and copies thereof may be purchased (849 O.G. 1221, Apr. 9, 1968).

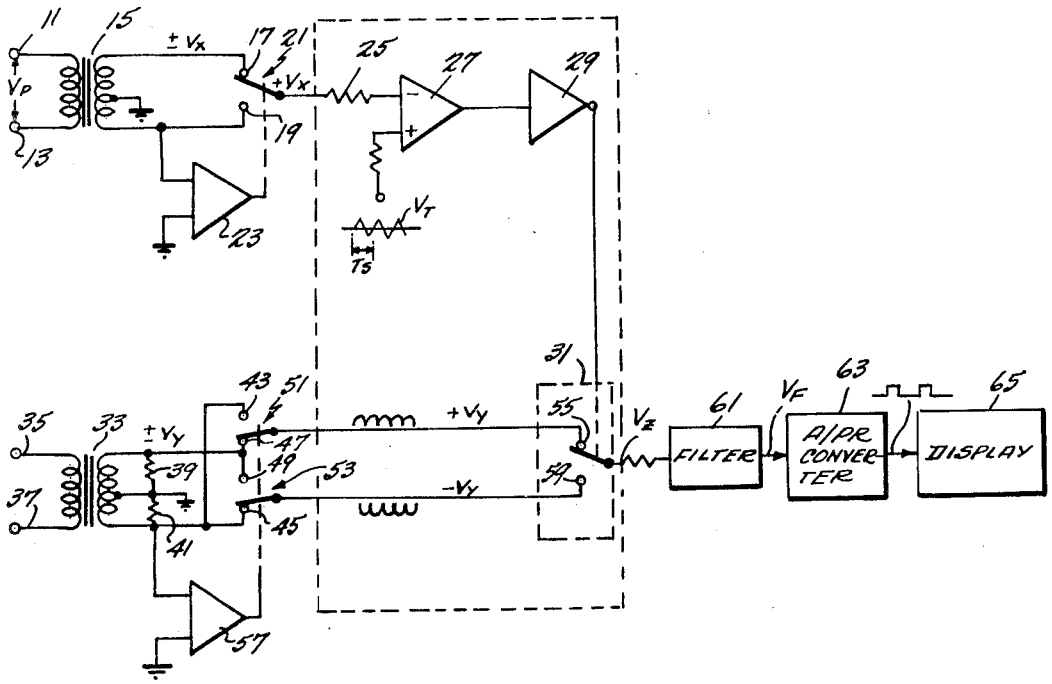

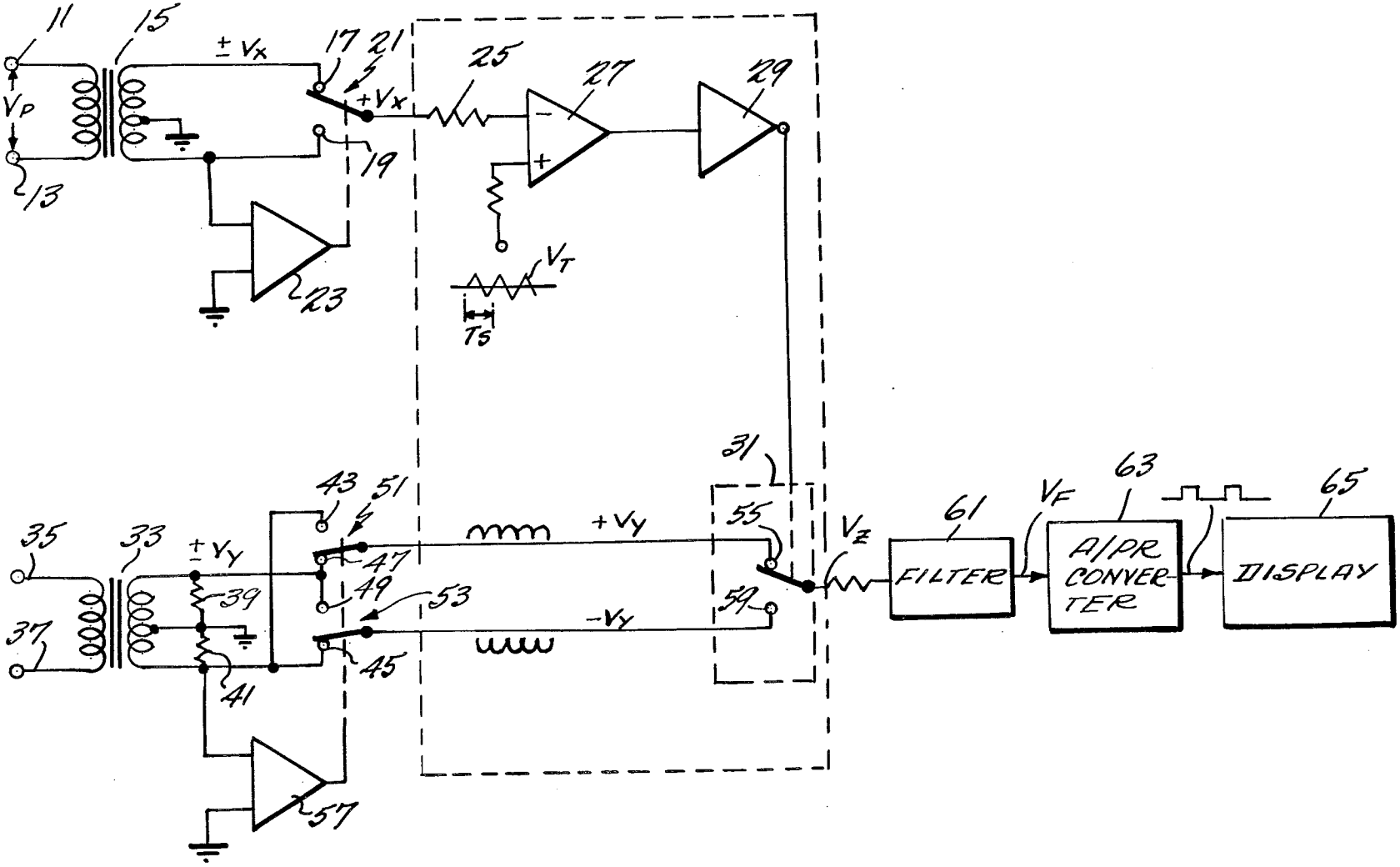
DISPLAY
A/DR CONVER TER
FILTER
65
63
61
$V_F$
$V_Z$
31
55
59
29
27
25
$V_T$
$T_S$
$+V_Y$
$-V_Y$
53
51
47
49
45
43
21
$+V_X$
19
17
23
57
$\pm V_X$
$\pm V_Y$
39
41
15
33
11
13
35
37
$V_P$